(12) United States Patent
Kim et al.

(10) Patent No.: US 9,110,546 B2
(45) Date of Patent: Aug. 18, 2015

(54) TOUCH PANEL AND IMAGE DISPLAY DEVICE INCLUDING THE SAME

(71) Applicant: LG Display Co., Ltd., Seoul (KR)

(72) Inventors: Sung-Chul Kim, Gyeonggi-do (KR); Jung-Han Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 252 days.

(21) Appl. No.: 13/718,260

(22) Filed: Dec. 18, 2012

(65) Prior Publication Data

US 2013/0342498 A1    Dec. 26, 2013

(30) Foreign Application Priority Data

Jun. 21, 2012  (KR) .................. 10-2012-0066806

(51) Int. Cl.
*G06F 3/044* (2006.01)
*H03K 17/96* (2006.01)
*G06F 3/041* (2006.01)

(52) U.S. Cl.
CPC .............. *G06F 3/044* (2013.01); *G06F 3/0418* (2013.01); *H03K 17/962* (2013.01); *G09G 2354/00* (2013.01); *H03K 2217/960715* (2013.01)

(58) Field of Classification Search
CPC .......... G09G 5/00; G06F 3/044; G06F 3/0418
USPC ................................................. 345/173, 174
See application file for complete search history.

(56) References Cited

U.S. PATENT DOCUMENTS

| 8,552,315 | B2* | 10/2013 | Yilmaz | 178/18.06 |
|---|---|---|---|---|
| 8,605,051 | B2* | 12/2013 | Hotelling et al. | 345/173 |
| 2008/0158169 | A1* | 7/2008 | O'Connor et al. | 345/173 |
| 2010/0156795 | A1 | 6/2010 | Kim et al. | |
| 2010/0258360 | A1* | 10/2010 | Yilmaz | 178/18.06 |
| 2012/0081324 | A1* | 4/2012 | Philipp | 345/173 |
| 2012/0200524 | A1* | 8/2012 | Vallis et al. | 345/174 |
| 2012/0299869 | A1* | 11/2012 | Hung et al. | 345/174 |
| 2012/0327000 | A1* | 12/2012 | Oh | 345/173 |
| 2013/0215075 | A1* | 8/2013 | Lee et al. | 345/174 |
| 2013/0321296 | A1* | 12/2013 | Lee et al. | 345/173 |
| 2014/0049478 | A1* | 2/2014 | Brunet et al. | 345/173 |
| 2014/0176459 | A1* | 6/2014 | Pyo | 345/173 |

FOREIGN PATENT DOCUMENTS

TW            201037586 A1    10/2010

OTHER PUBLICATIONS

Office Action dated Sep. 18, 2014 from the Taiwan Patent Office in counterpart Taiwanese Application No. 101146903.

* cited by examiner

*Primary Examiner* — Allison Johnson
*Assistant Examiner* — Afroza Chowdhury
(74) *Attorney, Agent, or Firm* — Morgan, Lewis & Bockius LLP

(57) ABSTRACT

A self capacitance type touch panel includes a touch driver including a plurality of touch ICs; and a touch unit including a plurality of touch groups that are controlled by the plurality of touch ICs, respectively, wherein each of the plurality of touch groups includes a plurality of pattern electrodes, and some touch ICs selected from the plurality of touch ICs apply sensing voltages to respective corresponding touch groups at a same timing.

8 Claims, 8 Drawing Sheets

TOUCH PANEL AND IMAGE DISPLAY DEVICE INCLUDING THE SAME

The present application claims the priority benefit of Korean Patent Application No. 10-2012-0066806 filed in the Republic of Korea on Jun. 21, 2012, which is hereby incorporated by reference in their entirety.

BACKGROUND

1. Field of the Disclosure

The present disclosure relates to a touch panel and an image display device including the same, and more particularly, to a touch panel capable of reducing touch noise due to the phase differences of sensing signals output from touch ICs by adjusting the phase differences of the sensing signals, and an image display device including the touch panel.

2. Discussion of the Related Art

Recently, with the development of information society, demands in the display field are increasing in various forms. In order to meet the demands, studies into various slim, lightweight image display devices having low power consumption, for example, a liquid crystal display (LCD), a plasma display panel (PDP), and an electro luminescent display (ELD), have been conducted.

As a touch panel for the image display devices, an add-on type touch screen panel that is manufactured by attaching a touch panel on a display panel, or an on-cell or in-cell type touch screen panel that is manufactured by installing a touch panel in a display panel, is attracting attention.

Such a touch screen panel is used as an output device for displaying images while being used as an input device for receiving a user's command of touching a specific area of a displayed image.

For example, if a user touches a screen while viewing an image displayed by a display panel, a touch panel detects location information of an area at which the touch has occurred, compares the detected location information to the location information of the image, and transfers the detected location information to a system, etc. so as to recognize a user's command.

Touch panels are classified into various types according to different methods of detecting location information, including resistive type, capacitive type, infrared ray type, and ultrasonic type.

The capacitive type is classified into self capacitance type and mutual capacitance type.

A self capacitance type touch panel in which a plurality of sensing electrodes are formed on a base member detects the location information of an area at which a touch has occurred by sensing a change in capacitance in the sensing electrodes.

In the self capacitance type touch panel, the sensing electrodes are formed with a single layer structure, and each sensing electrode has unique coordinate information.

A mutual capacitance type touch panel in which a plurality of first and second sensing electrodes having different directivities are formed on a base member detects the location information of an area at which a touch has occurred by sensing a mutual change in capacitance in the first and second sensing electrodes that are dividedly arranged.

In the mutual capacitance type touch panel, the first and second sensing electrodes are formed with a multi-layer structure, and x-axis and y-axis coordinate information is detected from the individual first and second sensing electrodes.

In the case of the in-cell type touch screen panel which is installed in an image display device, the capacity of the internal capacitor is very large since the distance between sensing electrodes and gate lines or data lines is short.

Accordingly, the in-cell type touch screen has a problem in that if it senses location information according to the mutual capacitance type, it is greatly influenced by noise while having a small change in capacitance when a touch has occurred.

Hereinafter, an in-cell type touch screen panel which is a self capacitance type will be described with reference to FIG. 1.

FIG. 1 is a top view schematically showing a touch panel which is driven according to a self capacitance type according to the related art.

As shown in FIG. 1, the touch panel 1 may include a touch driver 10 and a touch unit 20.

The touch driver 10 outputs sensing signals to the touch unit 20 to sense a touch input.

The touch unit 20 may include a plurality of pattern electrodes 22 formed on an array substrate (not shown).

The pattern electrodes 22 operate as sensing electrodes for sensing a touch input during a touch period, and as common electrodes to which a common voltage is applied during a display period.

A plurality of output channels of the touch driver 10 may be connected to the respective pattern electrodes through connection lines 12.

For example, the touch driver 10 includes 40 output channels, and the individual output channels are connected to 40 pattern electrodes.

That is, as shown in FIG. 1, the pattern electrodes on the first through eighth rows may be connected to the first through eighth connection lines 12a through 12h.

FIG. 2 is an equivalent circuit diagram of a touch unit included in a touch panel, and FIG. 3 is a view for explaining operation of sensing a touch according to the self capacitance type. The following description will be given with reference to FIGS. 1, 2, and 3.

Before a touch occurs (No Touch), gate capacitance $C_{gate}$ and data capacitance $C_{data}$ are generated between the touch unit 20 of the touch panel and the gate lines GL, and between the touch unit 20 and the data lines DL, respectively, and also parasite capacitance $C_{others}$ is generated.

When a touch has occurred (Touch), as shown in FIG. 2, touch capacitance $C_{finger}$ is generated between the touch unit 20 and a touch input device (a user's finger or a touching unit).

Also, resistance R which is a sum of input resistance and panel resistance, is applied as a load to the touch unit 20.

Due to the change in capacitance of the touch panel, a time period taken for a sensing voltage Vo to be discharged to be a sensed voltage Vx before a touch occurs (No Touch) is different from a time period taken for a sensing voltage Vo to be discharged to be a sensed voltage Vx when a touch has occurred (Touch).

That is, as shown in FIG. 3, a time period taken for a sensing voltage Vo to be discharged to be a sensed voltage Vx before a touch occurs (No Touch) is "tx", whereas a time period taken for a sensing voltage Vo to be discharged to be a sensed voltage Vx when a touch has occurred (Touch) is "tx+Δt" that is longer than "tx".

The reason is because a sensing time period taken for a sensing voltage Vo to be discharged to be a sensed voltage Vx increases since the total capacitance of the touch unit 20 increases to "Cgate+Cdata+Cothers+Cfinger" when a touch has occurred.

Also, although shown in the drawings, due to the change in capacitance of the touch panel, a sensing time period taken for a sensing voltage Vo to be charged to be a sensed voltage Vx when a touch has occurred (Touch) also becomes longer than a sensing time period taken for a sensing voltage Vo to be charged to be a sensed voltage Vx before a touch occurs (No Touch).

As such, the self capacitance type touch panel determines whether a touch has occurred by comparing sensing time periods taken before a touch occurs and after a touch has occurred.

The in-cell type touch panel which is driven according to the self capacitance type requires a large number of pattern electrodes for increasing touch sensitivity.

However, existing touch drivers do not have a sufficient number of output channels that can be respectively connected to the increased number of pattern electrodes.

SUMMARY OF THE INVENTION

Accordingly, the present invention is directed to a touch panel and an image display device including the same, which substantially obviate one or more of the problems due to limitations and disadvantages of the related art.

An object of the present disclosure is to provide a touch panel capable of reducing touch noise due to the phase differences of sensing signals output from a plurality of touch ICs for controlling a plurality of touch groups to sense a touch from the outside for each touch group by adjusting the phase differences of the sensing signals, and an image display device including the touch panel.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided a self capacitance type touch panel includes a touch driver including a plurality of touch ICs; and a touch unit including a plurality of touch groups that are controlled by the plurality of touch ICs, respectively, wherein each of the plurality of touch groups includes a plurality of pattern electrodes, and some touch ICs selected from the plurality of touch ICs apply sensing voltages to respective corresponding touch groups at a same timing.

In another aspect, an image display device includes a display panel for displaying an image; and a self capacitance type touch panel sensing a touch input, which comprises a touch driver including a plurality of touch ICs; and a touch unit including a plurality of touch groups that are controlled by the plurality of touch ICs, respectively, wherein each of the plurality of touch groups includes a plurality of pattern electrodes, and a plurality of touch ICs selected from among the plurality of touch ICs apply sensing voltages to respective corresponding touch groups at the same timing.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
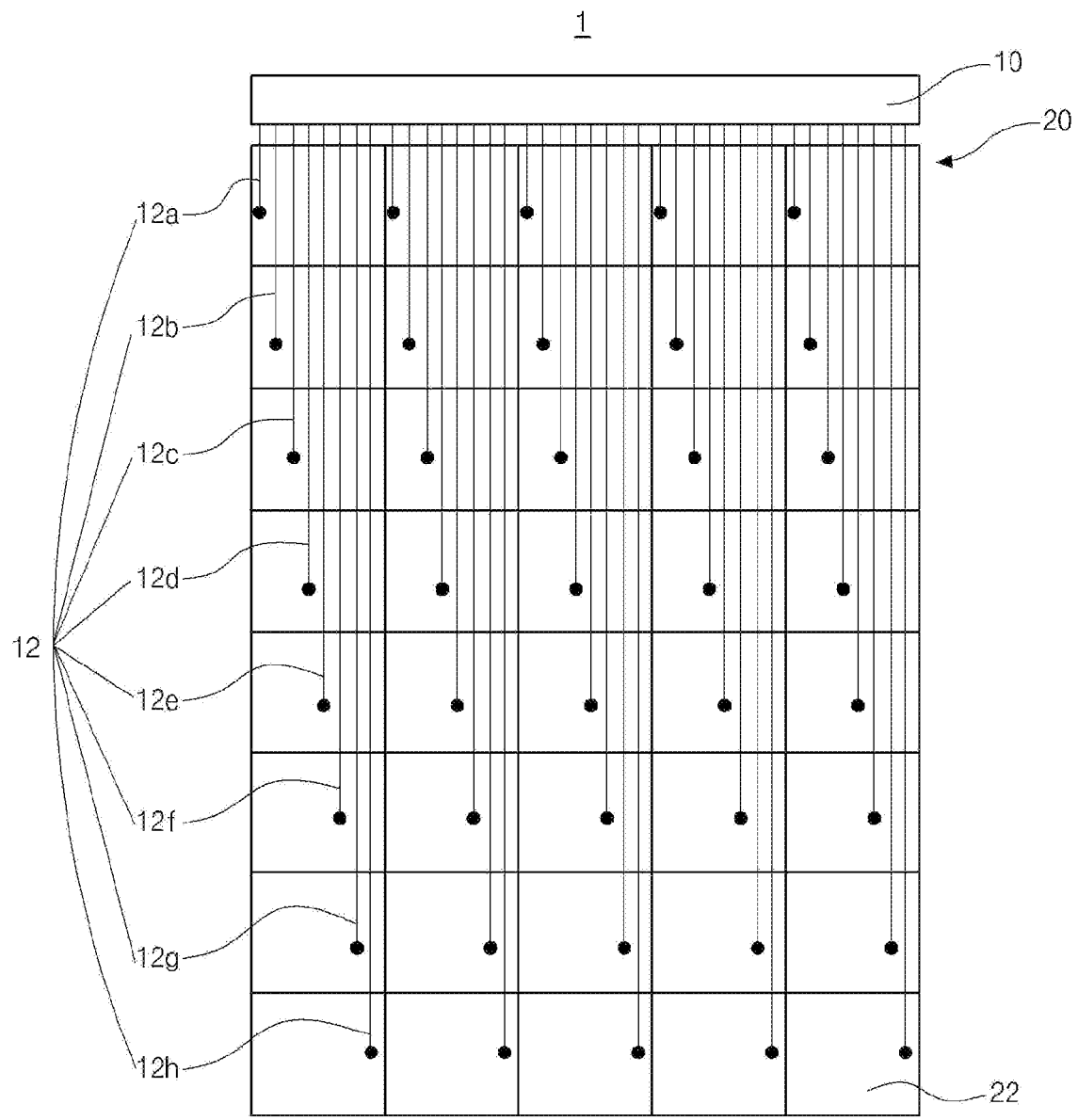
FIG. 1 is a top view schematically showing a self capacitance type touch panel according to the related art.
Figure 2:
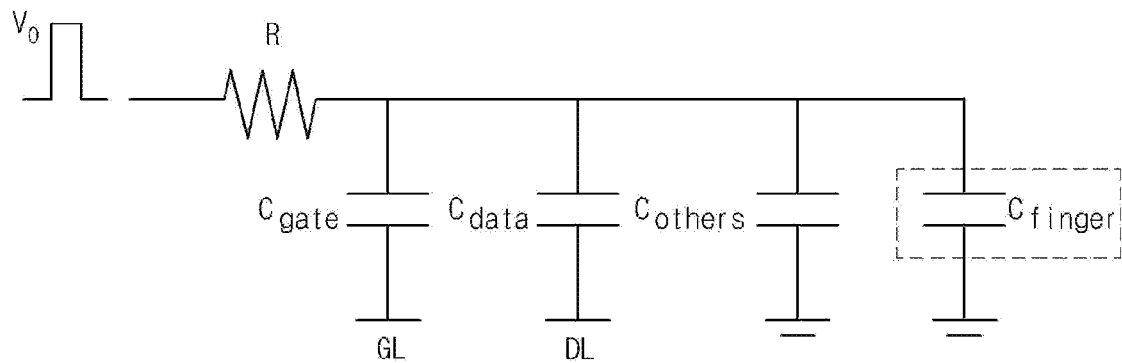
FIG. 2 is an equivalent circuit diagram of a touch unit included in a touch panel.
Figure 3:
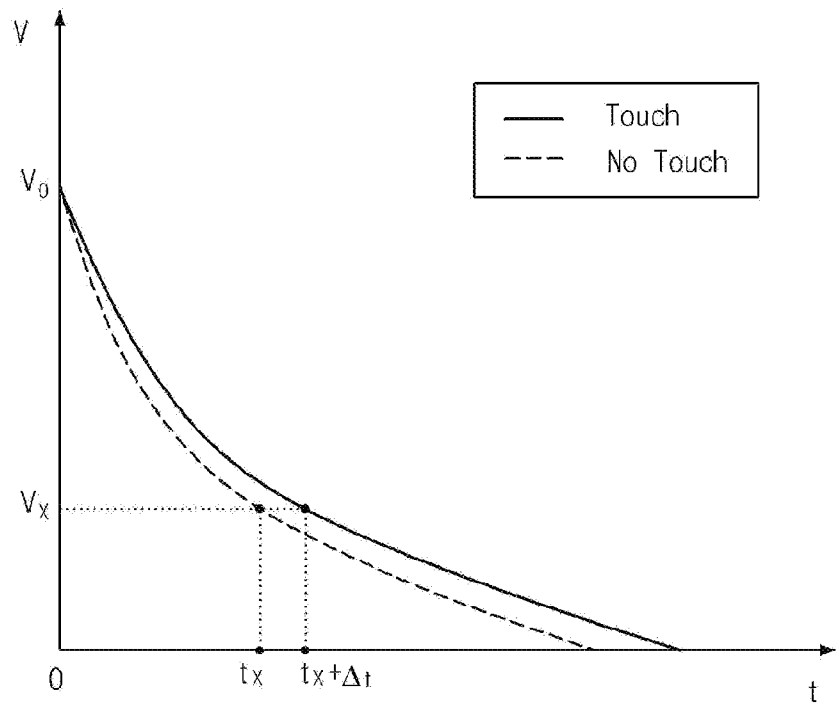
FIG. 3 is a view for explaining operation of sensing a touch according to a self capacitance type.
Figure 4:
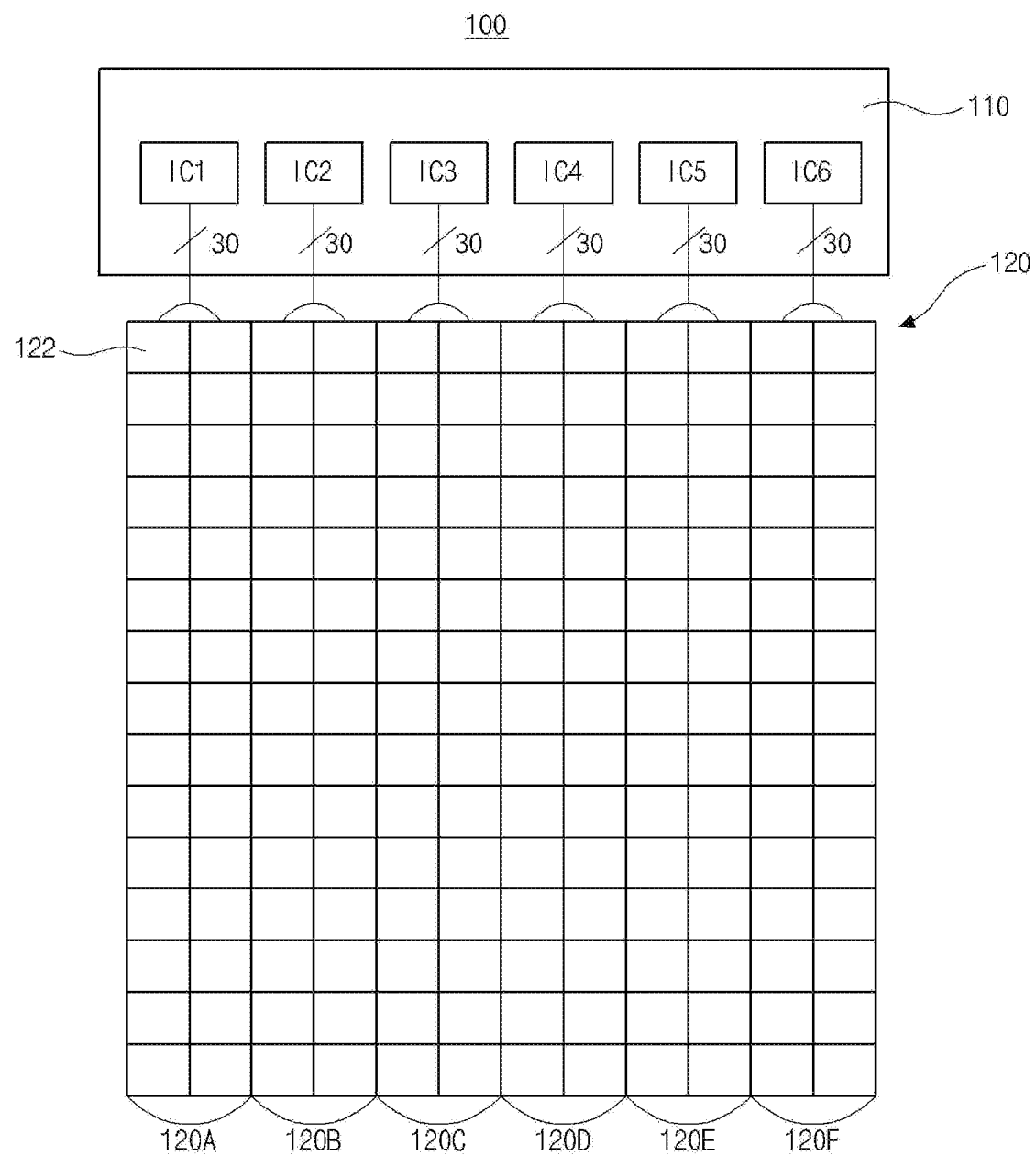
FIG. 4 is a view schematically showing a touch panel according to a first embodiment of the present invention.

FIG. 4 is a view schematically showing a touch panel according to a first embodiment of the present invention.

As shown in FIG. 4, an image display device according to the present invention includes a display panel (not shown), a source driver (not shown), a gate driver (not shown), a timing controller (not shown), etc.

The display panel may include an array substrate in which a plurality of gate lines (not shown) and a plurality of data lines (not shown) crossing each other to define a plurality of pixels are formed, and a color filter substrate that is opposite to and bonded with the array substrate.

Also, each pixel may include a switching device (not shown), a storage capacitor (not shown), etc.

Accordingly, the image display device controls the turn-on/off operations of switching devices to apply various magnitudes of data voltages to the respective pixels, thereby displaying various images.

The storage capacitor functions to maintain a data voltage constant for 1 frame.

The source driver may include at least one source driver IC, generate data voltages using image signals and a plurality of data control signals received from the timing controller, and supply the data voltages to the display panel through the data lines.

The gate driver may be formed, for example, in a Gate In Panel (GIP) type. The gate driver may generate gate voltages using control signals received from the timing controller, and supply the gate voltages to the display panel using the gate lines.

Each gate control signal may include a gate start pulse, a gate shift clock, etc.

The timing controller may receive a plurality of image signals, and a plurality of control signals, such as a vertical synchronization signal Vsync, a horizontal synchronization signal Hsync, a data enable signal DE, etc., from a system such as a graphic card, through a low voltage differential signal (LVDS) interface.

Also, the timing controller may generate gate control signals for controlling the gate driver, and data control signals for controlling the source driver, using the plurality of control signals.

Although not shown in the drawings, a power supply unit (not shown) for generating driving voltages for driving the components of the image display device using a supply voltage received from an external device, and supplying the driving voltages, may be further provided.

Meanwhile, the image display device may further include a touch panel 100 for sensing a touch input.

The touch panel 100 may include a touch driver 110 including a plurality of touch ICs IC1 through IC6, and a touch unit 120 including a plurality of pattern electrodes 122.

The touch driver 110 may include a memory unit (not shown), a comparator (not shown), etc., and functions to output sensing signals to the touch unit 120 to sense a touch input.

The memory unit (not shown) may store a reference sensing time period for each pattern electrode, taken for a sensing voltage to be discharged to be a sensed voltage before a touch occurs.

Also, the memory unit (not shown) may store a reference sensing time period for each pattern electrode, taken for a sensing voltage to be charged to be a sensed voltage before a touch occurs.

The comparator may compare a changed sensing time period received from the memory when a touch has occurred to the reference sensing signal to determine whether a touch has occurred, and obtain location information of an area at which the touch has occurred.

Also, the touch driver 110 may further include a voltage switching unit (not shown) for transferring a sensing voltage or a common voltage to the pattern electrodes 122.

The pattern electrodes 122 operate as sensing electrodes for sensing a touch input during a touch period, and as common electrodes to which a common voltage is applied during a display period.

Each pattern electrode 122 may receive the sensing voltage during the touch period and the common voltage during the display period, according to switching of the voltage switching unit.

That is, the voltage switching unit may transfer a sensing voltage or a common voltage, for example, according to a synchronization signal supplied from the timing controller.

For example, the sensing voltage may be sequentially transferred to the pattern electrodes 122 during the touch period, and the common voltage may be transferred to the pattern electrodes 122 at the same timing during the display period.

Meanwhile, a plurality of touch groups 120A through 120F each consisting of a plurality of pattern electrodes 122 may be defined in the touch unit 120, and the touch groups 120A through 120F may be controlled by the touch ICs IC1 through IC6, respectively.

For example, if each touch group consists of 30 pattern electrodes, the first touch IC IC1 may transfer the sensing voltage to the 30 pattern electrodes of the first touch group 120A at the same time through 30 output channels.

Likewise, each of the second through sixth touch ICs IC2 through IC6 may transfer the sensing voltage to the 30 pattern electrodes of the corresponding one of the second through sixth touch groups 120B through 120F through 30 output channels.

The touch driver 110 may control the first through sixth touch ICs IC1 through IC6 to transfer the sensing voltage to a plurality of touch groups selected from among the plurality of touch groups 120A through 120F at the same timing.

For example, the plurality of touch groups 120A through 120F are divided into three parts (for example, the first and fourth touch ICs IC1 and IC4, the second and fifth touch ICs IC2 and IC5, and the third and sixth touch ICs IC3 and IC6), the first and fourth touch ICs IC1 and IC4 output the sensing voltage at the same timing, the second and fifth touch ICs IC2 and IC5 output the sensing voltage at the same timing, and the third and sixth touch ICs IC3 and IC6 output the sensing voltage at the same timing, sequentially.

As such, the in-cell type touch panel which is driven according to the self capacitance type includes a plurality of touch ICs to sense a plurality of pattern electrodes for each touch group, and controls individual touch groups sequentially, thereby increasing touch sensitivity.

Figure 5:
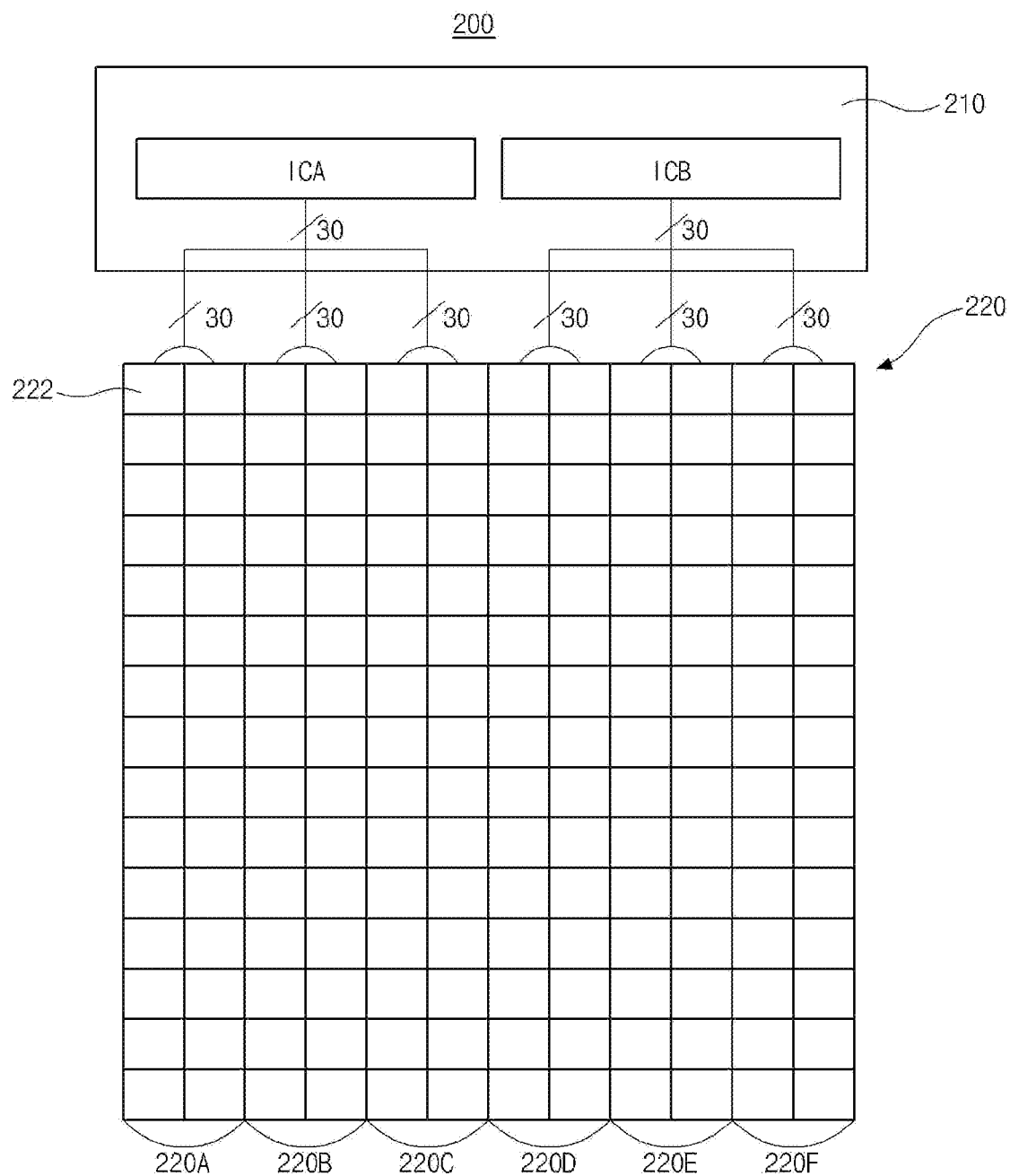
FIG. 5 is a view schematically showing a touch panel according to a second embodiment of the present invention.

FIG. 5 is a view schematically showing a touch panel 200 according to a second embodiment of the present invention.

Since a part of the configuration of the second embodiment is substantially the same as the corresponding part of the first embodiment, the following description will be given based on differences from the first embodiment.

Referring to FIG. 5, the touch panel 200 may include a touch driver 210 including a plurality of touch ICs ICA and ICB, and a touch unit 220 including a plurality of pattern electrodes 222.

Meanwhile, a plurality of touch groups 220A through 220F each consisting of a plurality of pattern electrodes 222 may be defined in the touch unit 220, and the plurality of touch groups 220A through 220F may be controlled by the plurality of touch ICs ICA and ICB, respectively.

Also, the touch driver 210 may include a touch group switching unit (not shown) for changing the touch groups 220A through 220F that are controlled by the touch ICs ICA and ICB.

A sensing voltage output from each touch IC may be transferred to different touch groups according to switching of the touch group switching unit.

That is, the touch group switching unit may transfer a sensing voltage to the respective touch groups, sequentially, in response to a switching signal so that a plurality of touch groups can be sensed through a touch IC.

For example, if each touch group consists of 30 pattern electrodes, the first touch IC ICA may transfer a sensing voltage to the 30 pattern electrodes of each of the first through third touch groups 220A through 220C, sequentially, through 30 output channels.

Likewise, the second touch IC ICB may transfer a sensing voltage to the 30 pattern electrodes of each of the fourth through sixth touch groups 220D through 220F, sequentially, through 30 output channels.

At this time, it is also possible to simultaneously transfer the sensing voltage to the pattern electrodes belonging to the same touch group.

As such, since the in-cell type touch panel which is driven according to the self capacitance type, according to the second embodiment, includes the touch group switching unit so that a plurality of touch groups can be sensed through a touch IC, it is possible to reduce the number of required touch ICs while increasing touch sensitivity.

Figure 6:
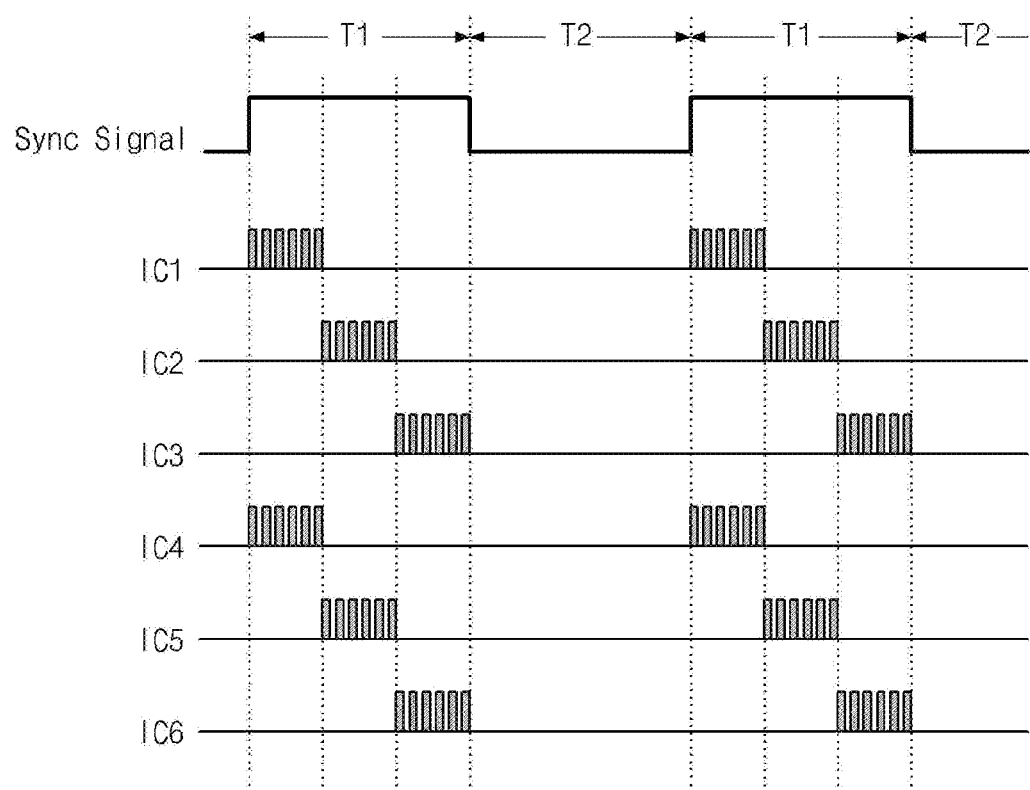
FIG. 6 is a timing diagram of a plurality of sensing signals that are supplied to a touch unit from a touch driver according to the present invention.

FIG. 6 is a timing diagram of a plurality of sensing signals that are supplied to a touch unit from a touch driver according to the present invention. The following description will be given with reference to FIGS. 4 and 6.

As shown in FIG. 6, a driving time period of the touch driver 110 may be divided to a touch period T1 and a display period T2 according to a synchronization signal Sync Signal that is supplied from a timing controller.

In the touch period T1, sensing voltages output from the touch ICs IC1 through IC6 may be transferred to the respective touch groups of the touch unit 120, sequentially.

As shown in FIG. 6, the sensing voltages of the first and fourth touch ICs IC1 and IC4 are output at the same timing, the sensing voltages of the second and fifth touch ICs IC2 and IC5 are output at the same timing, and the sensing voltages of the third and sixth touch ICs IC3 and IC6 are output at the same timing, sequentially.

At this time, it is also possible to simultaneously transfer a sensing voltage to the pattern electrodes belonging to the same touch group.

However, since the individual pattern electrodes 122 have different loads according to their locations on the touch unit 120, the pattern electrodes 122 may require different sensing voltages to effectively sense a touch.

Accordingly, it is necessary to, in advance, set a sensing voltage required by each pattern electrode 122 for effectively sensing a touch.

That is, voltages required by the pattern electrodes belonging to the same touch group are measured through an oscilloscope, etc., and the greatest value of the measured voltage values may be set to a sensing voltage value for controlling the corresponding touch group.

The set sensing voltage value may be stored in the touch IC for controlling the corresponding touch group.

As such, a sensing voltage by which all the pattern electrodes of each touch group can sense a touch effectively may be stored in the corresponding touch IC.

However, since the touch groups are spatially separated and driven by different touch ICs although a sensing voltage has been set for each touch group, there may be phase differences between sensing voltages that are transferred to the respective touch groups at the same timing.

That is, since the touch ICs have different characteristics and different loads, phase differences may be generated even when the touch ICs output the same sensing voltage at the same timing.

This will be described in more detail with reference to FIGS. 7A and 7B, below.

Figure 7A:
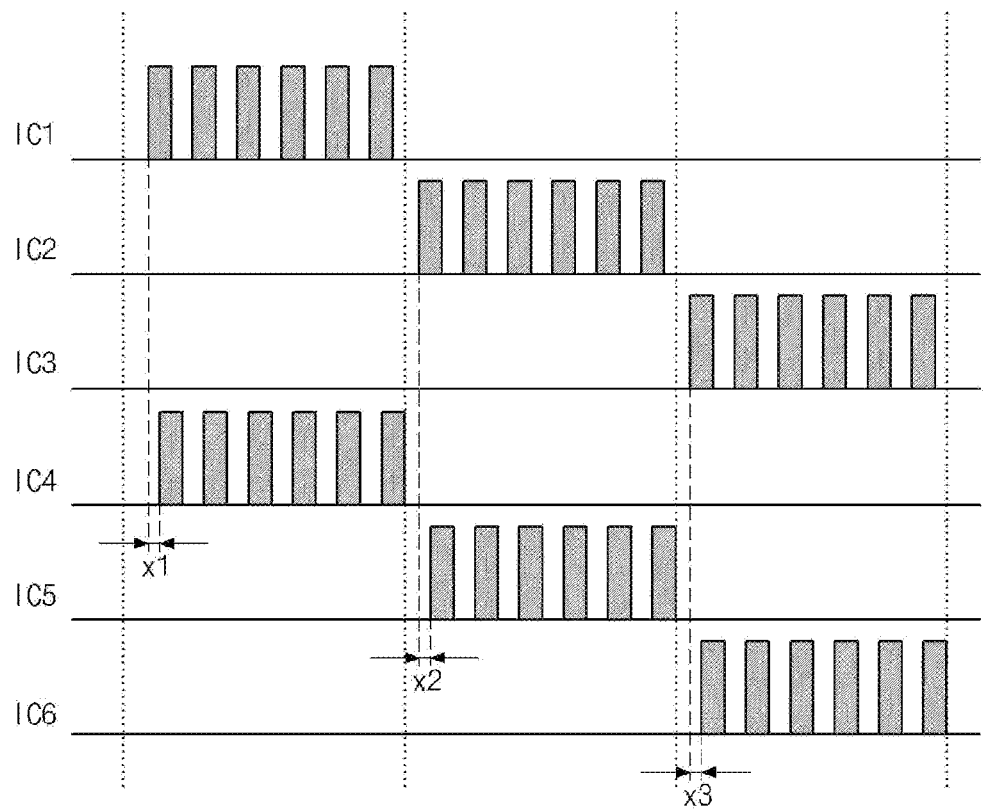
FIGS. 7A and 7B are views for explaining an example in which touch noise is generated according to the phase differences between sensing voltages in the touch panel according to the present invention.
Figure 7B:
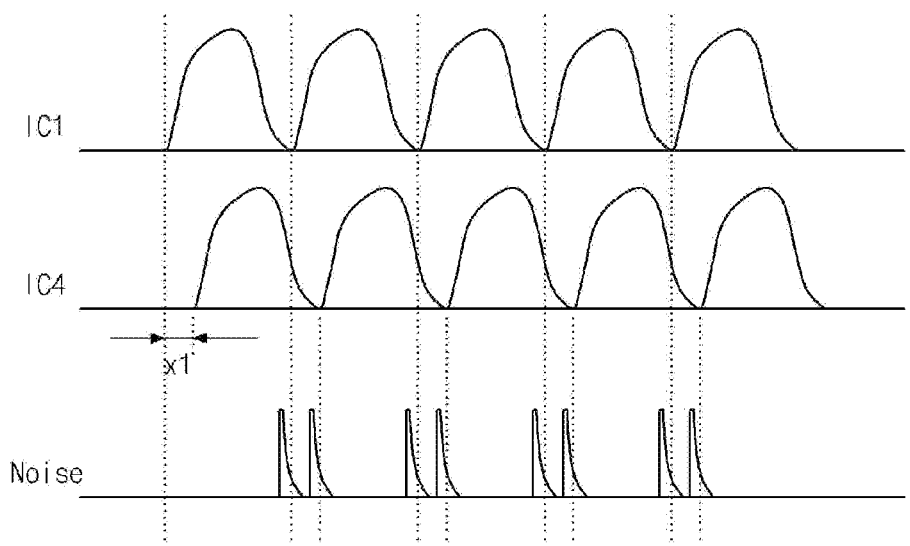

FIGS. 7A and 7B are views for explaining an example in which touch noise is generated according to the phase differences between sensing voltages in the touch panel according to the present invention.

As shown in FIG. 7A, a phase difference of x1 is generated between the sensing voltages of the first and fourth touch ICs IC1 and IC4, which are output at the same timing, a phase difference of x2 is generated between the sensing voltages of the second and fifth touch ICs IC2 and IC5, which are output at the same timing, and a phase difference of x3 is generated between the sensing voltages of the third and sixth touch ICs IC3 and IC6, which are output at the same timing.

As a result, as shown in FIG. 7B, touch noise may be generated according to the phase difference x1 between the sensing voltages of the first and fourth ICs IC1 and IC4, which are output at the same timing.

If such touch noise is generated, a signal-to-noise ratio (SNR) is reduced, which influences the sensing voltages, different driving voltages, etc., resulting in deterioration of the performance of the image display device.

Hereinafter, a method of reducing touch noise by adjusting the phase difference between sensing voltages in a touch panel will be described.

Figure 8A:
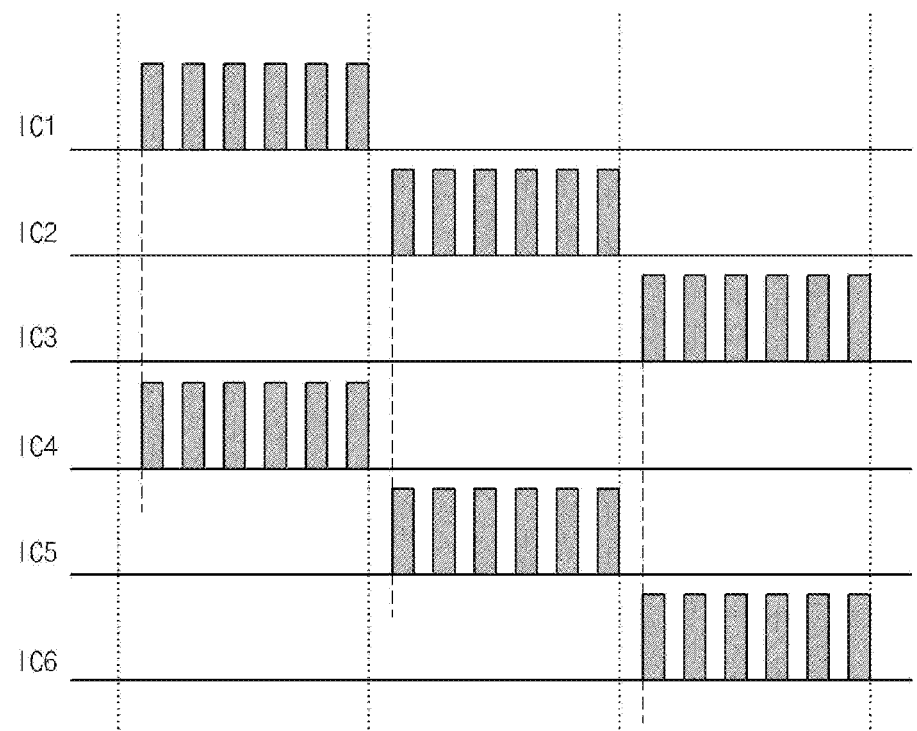
FIGS. 8A and 8B are views for explaining a reduction of touch noise according to the phase differences of sensing voltages due to adjustment of the phase differences of the sensing voltages in a touch panel according to a third embodiment of the present invention.
Figure 8B:
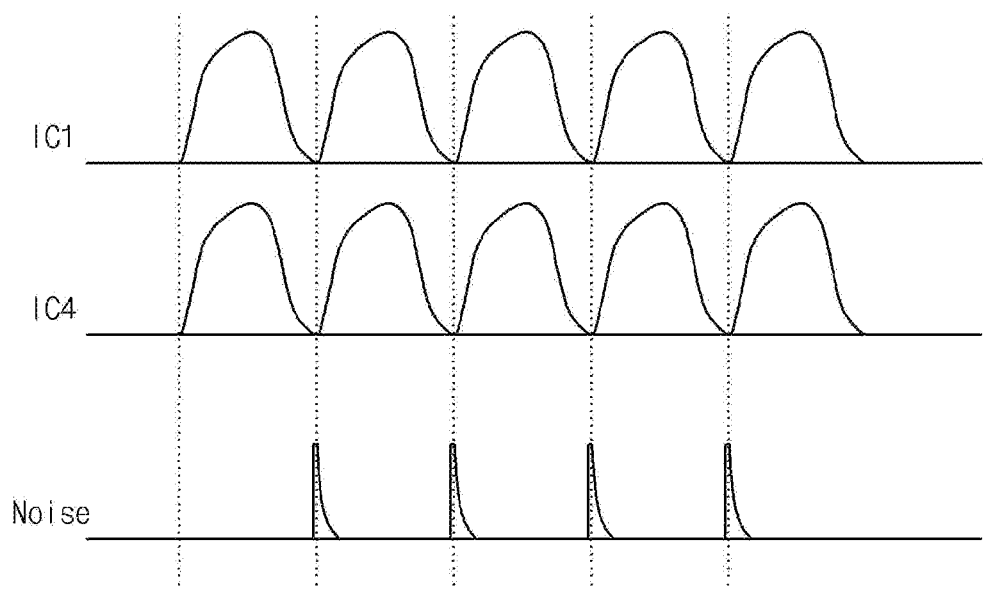

FIGS. 8A and 8B are views for explaining a reduction of touch noise according to the phase differences of sensing voltages due to adjustment of the phase differences of the sensing voltages in a touch panel according to a third embodiment of the present invention.

In order to achieve phase synchronization by eliminating the phase difference between sensing voltages, it is necessary to set a sensing voltage for each pattern electrode.

That is, voltages required by pattern electrodes belonging to the same touch group are measured through an oscilloscope, etc., and the greatest value of the measured voltage values may be set to a sensing voltage value for controlling the corresponding touch group.

A sensing voltage for controlling each touch group, that is, a sensing voltage whose phase difference has been adjusted through an oscilloscope, etc. may be stored in each touch IC.

As shown in FIG. 8A, the phase difference between the sensing voltages of the first and fourth touch ICs IC1 and IC4, which are output at the same timing, is adjusted so that the sensing voltages of the first and fourth touch ICs IC1 and IC4 have the same phase, the phase difference between the sensing voltages of the second and fifth touch ICs IC2 and IC5, which are output at the same timing, is adjusted so that the sensing voltages of the second and fifth touch ICs IC2 and IC5 have the same phase, and the phase difference between the sensing voltages of the third and sixth touch ICs IC3 and IC6, which are output at the same timing, is adjusted so that the sensing voltages of the third and sixth touch ICs IC3 and IC6 have the same phase.

Consequently, as shown in FIG. 8B, touch noise may be reduced when the sensing voltages of the first and fourth ICs IC1 and IC4, which are output at the same timing, are driven.

Figure 9:
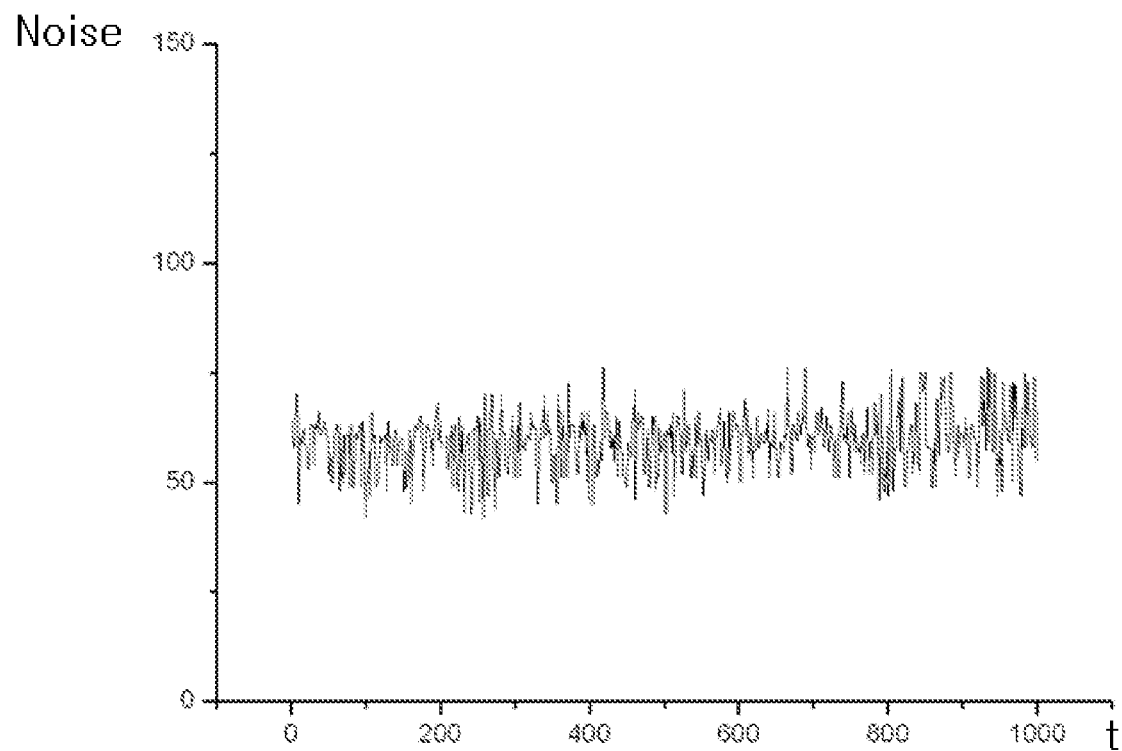
FIGS. 9 and 10 are views for comparing reductions of touch noise due to adjustment of the phase differences of the sensing signals in the touch panel according to the present invention.
Figure 10:
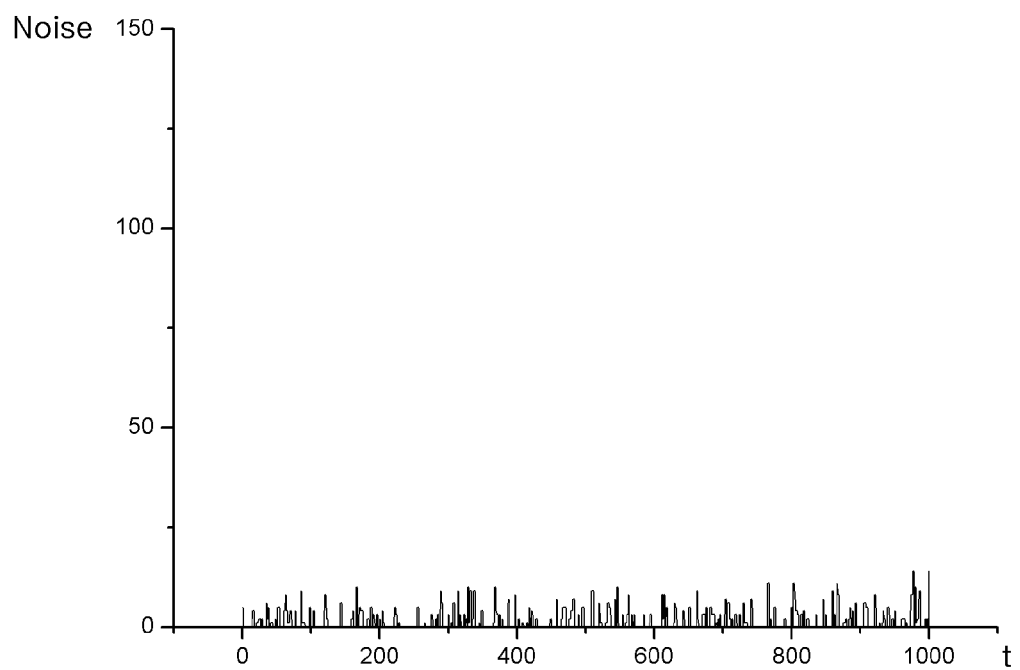

FIGS. 9 and 10 are views for comparing reductions of touch noise due to adjustment of the phase differences of the sensing signals in the touch panel according to the present invention.

FIG. 9 shows a touch noise value when there is a phase difference between sensing voltages, and FIG. 10 shows a touch noise value when there is no phase difference between sensing voltages.

As shown in FIG. 9, when there is a phase difference between sensing voltages, a touch noise value of about 50 through 80 is measured.

However, if phase synchronization between sensing voltages is achieved, as shown in FIG. 10, a touch noise value below about 15 is measured.

According to the touch panel as described above, by adjusting the phase difference between sensing voltages output from a touch IC at the same timing, and controlling each touch group with the adjusted sensing voltages, it is possible to reduce touch noise due to the phase differences of sensing signals.

As a result, a signal-to-noise ratio (SNR) is improved, which leads to an improvement in performance of the touch panel, such as accuracy upon detection of a touch, touch sensitivity, etc.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. A self capacitance type touch panel, comprising:
a touch driver including a plurality of touch ICs; and
a touch unit including a plurality of touch groups that are controlled by the plurality of touch ICs, respectively,
wherein each of the plurality of touch groups includes a plurality of pattern electrodes, and some touch ICs selected from the plurality of touch ICs apply sensing voltages to respective corresponding touch groups at a same timing, and
wherein the plurality of touch ICs that apply the sensing voltage to the respective touch groups at the same timing control the respective touch groups using sensing voltages adjusted to have the same phase and stored in advance.

2. The touch panel according to claim 1, wherein each touch IC comprises:
a memory unit configured to store a reference sensing time period for each pattern electrode, taken for the sensing voltage to be charged or discharged to be a sensed voltage before a touch input is generated; and
a comparator configured to compare a changed sensing time period received from the memory unit when the touch input has been generated, to the reference sensing time period, and to determine whether or not a touch has occurred according to the results of the comparison.

3. The touch panel according to claim 1, wherein the touch driver further comprises a voltage switching unit configured to transfer the sensing voltage or a common voltage to the pattern electrodes.

4. The touch panel according to claim 1, wherein the touch driver further comprises a touch group switching unit configured to switch connections of output channels of each touch IC in order to change touch groups that are controlled by the touch IC.

5. An image display device, comprising:
a display panel for displaying an image; and
a self capacitance type touch panel sensing a touch input, including:
a touch driver including a plurality of touch ICs; and
a touch unit including a plurality of touch groups that are controlled by the plurality of touch ICs, respectively,
wherein each of the plurality of touch groups includes a plurality of pattern electrodes, and some touch ICs selected from among the plurality of touch ICs apply sensing voltages to respective corresponding touch groups at a same timing, and
wherein the plurality of touch ICs that apply the sensing voltage to the respective touch groups at the same timing control the respective touch groups using sensing voltages adjusted to have the same phase and stored in advance.

6. The image display device according to claim 5, wherein each touch IC comprises:
a memory unit configured to store a reference sensing time period for each pattern electrode, taken for the sensing voltage to be charged or discharged to be a sensed voltage before a touch input is generated; and
a comparator configured to compare a changed sensing time period received from the memory unit when the touch input has been generated, to the reference sensing time period, and to determine whether or not a touch has occurred according to the results of the comparison.

7. The image display device according to claim 5, wherein the touch driver further comprises a voltage switching unit configured to transfer the sensing voltage or a common voltage to the pattern electrodes.

8. The image display device according to claim 5, wherein the touch driver further comprises a touch group switching unit configured to switch connections of output channels of each touch IC in order to change touch groups that are controlled by the touch IC.

* * * * *